United States Patent [19]

Takahasi et al.

[11] 4,337,459
[45] Jun. 29, 1982

[54] DIGITAL-TO-ANALOG CONVERTER

[75] Inventors: Masauki Takahasi, Utsunomiya; Hisami Tanaka, Yokohama; Masao Yamasawa, Sagamihara; Michinobu Ohhata, Kawasaki, all of Japan

[73] Assignee: Fujitsu Limited, Kawasaki, Japan

[21] Appl. No.: 150,679

[22] Filed: May 16, 1980

[30] Foreign Application Priority Data

May 18, 1979 [JP] Japan .................................. 54-61336

[51] Int. Cl.³ ........................................... H03K 13/02
[52] U.S. Cl. ............................................. 340/347 DA
[58] Field of Search ................ 340/347 DA, 347 AD, 340/347 M, 347 SY

[56] References Cited

PUBLICATIONS

Albarran, "IEEE Journal of Solid–State Circuits", vol. SC-11, No. 5, Dec. 1976, pp. 772-779.

Primary Examiner—Charles D. Miller
Attorney, Agent, or Firm—Staas & Halsey

[57] ABSTRACT

A digital-to-analog converter of the capacitive voltage divider type, which comprises an output conductor, a ground conductor, a power source conductor, an array of capacitors and an array of switches connected between said output conductor and either the ground conductor or the power source conductor, and which provides a high impedance element connected between said output conductor and the ground conductor.

5 Claims, 5 Drawing Figures

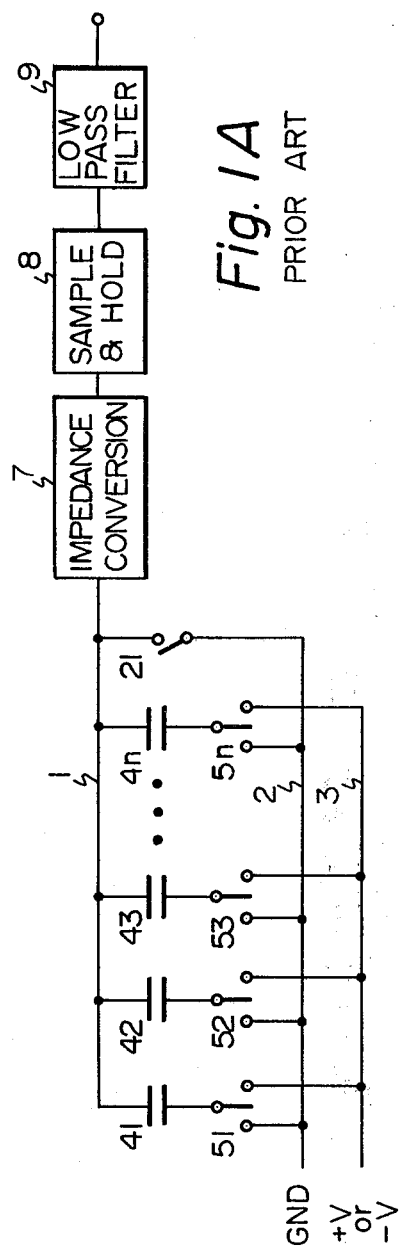
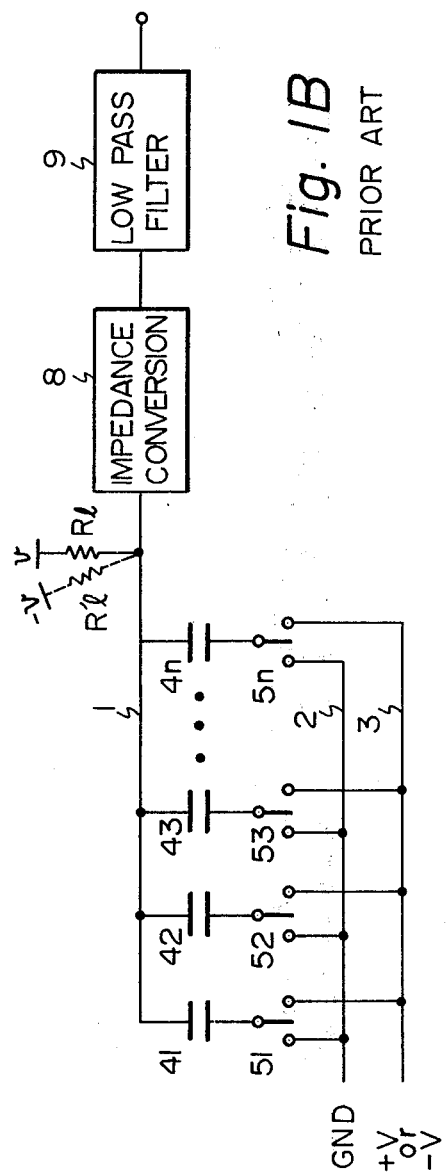
Fig. 1A PRIOR ART
Fig. 1B PRIOR ART

DIGITAL-TO-ANALOG CONVERTER

BACKGROUND OF THE INVENTION

1. Field of the Invention

The present invention relates to a digital-to-analog converter (DA converter) of the capacitive voltage divider type. The DA converter of the present invention is used, for example, for obtaining audio signals in data processing systems, such as a pulse code modulation (PCM) transmission system. A DC converter is used as a decoder in the PCM transmission system.

2. Description of the Prior Art

The prior art DA converters of the capacitive voltage type are illustrated in FIGS. 1A and 1B. In the DA converter of FIG. 1A, capacitors 41, 42 . . . 4n, each of which has, for example, a capacitance C, are connected between a common output conductor 1 and switches 51, 52, . . . 5n. One side of the selective contacts of the switches 51, 52, . . . 5n are connected to a ground conductor 2, while the other side of the selective contacts of the switches 51, 52, . . . 5n are connected to a power source conductor 3 having a potential of $+V$ or $-V$.

In accordance with the selective switching of the switches 51, 52, . . . 5n for closing either side of the selective contacts, the potential of the output conductor 1 is caused to have a value which is determined by the ratio of the number of capacitors connected to the power source conductor 3 to the number of the entire capacitors. If k capacitors out of the n entire capacitors are connected to the power source conductor 3, and hence "n-k" capacitors are connected to the ground conductor 2, the potential of the output conductor 1 is equal to $k/n \cdot V$, where V is the potential of the power source conductor 3. Thus a DA conversion is effected in the capacitor array circuit of FIG. 1A.

In order to discharge the charges of the output conductor 1, due to the leakage resistance of the output conductor 1 prior to an operation of the DA converter of FIG. 1A, and prevent an incorrect conversion due to said charges, the ground side contacts of the switches 51, 52, . . . 5n are closed and a switch 21 connected between the output conductor 1 and the ground conductor 2 is closed, so that the residual charges of the capacitors and the output conductor are eliminated.

Also, in order to prevent transmission of a zero output voltage, due to the closing of the switch 21, to the output of a low pass filter 9, as the output of the device of FIG. 1A, and a resulting deterioration of the signal to noise characteristic of the device of FIG. 1A, a series connected impedance conversion circuit 7 and a sample and hold circuit 8 are connected between the output of the capacitor array circuit an the low pass filter 9. The sample and hold circuit 8 samples the potentials of the output conductor 1 in asynchronism with the switching of the switch 21 and holds the sampled potentials. However, such provision of a sample and hold circuit is disadvantageous, because a sample and hold circuit is apt to effect abnormal oscillations, is difficult to manufacture, increases consumption of electrical power and increases the chip area of the integrated circuit for the device of FIG. 1A.

In the DA converter of FIG. 1B, no switch is connected between the output conductor 1 and the ground conductor 2 and hence no grounding of the output conductor 1 is effected, so that no sample and hold circuit is necessary and the output of the impedance conversion circuit is directly connected to the low pass filter 9. However, the DA converter of FIG. 1B is disadvantageous, because the potential of the output conductor is made unstable, due to the charges injected from a voltage source v (or $-V$) through an indefinite leakage resistance $R_l$ (or $R_l'$). It is also disadvantageous in that the charges, which were stored in the output conductor 1 during the manufacture of the integrated circuit of the device of FIG. 1B, cause an offset of the output voltage, and the extent of this offset changes with time, the extent sometimes exceeding the limit of the operation range.

Such a prior art DA converter is disclosed in, for example, Catalogue DF 331, DF 332 of Siliconix Incorporated published in February of 1978.

The present invention has been proposed in order to prevent the above explained disadvantages in the prior art DA converters of the capacitive voltage divider type.

SUMMARY OF THE INVENTION

It is the main object of the present invention to provide a DA converter of the capacitive voltage divider type which has no sample and hold circuit and which is free from the fluctuations of the potential of the output conductor, so that said DA converter can be produced relatively easily and economically and the correct operation of said DA converter is ensured.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 1A and 1B illustrate the circuit diagrams of the prior art DA converters of the capacitive voltage divider type.

DESCRIPTION OF THE PREFERRED EMBODIMENTS

Figure 2:
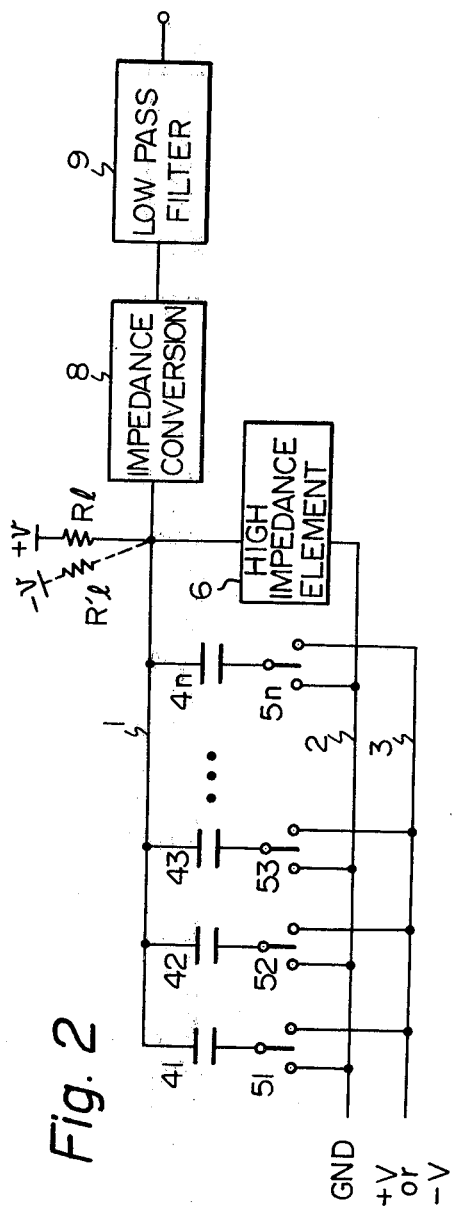
FIG. 2 illustrates a circuit diagram of a DA converter of the capacitive voltage divider type in accordance with an embodiment of the present invention.

The DA converter of the capacitive voltage divider type of FIG. 2, as an embodiment of the present invention, comprises an output conductor 1, a ground conductor 2, a power source conductor 3, an array of capacitors 41, 42, 43 . . . 4n, and an array of switches 51, 52, 53 . . . 5n. The connection and the operation of the capacitors 41, 42, 43 . . . 4n and the switches 51, 52, 53 . . . 5n are the same as in the DA converters of FIGS. 1A and 1B. The output of the capacitor array circuit is connected to an impedance conversion circuit 8 which is connected to a low pass filter 9.

In the DA converter of FIG. 2, a high impedance element 6 is connected between the output conductor 1 and the ground line 2. When the DA converter is not in operation, the charges stored in the capacitors 41, 42, 43 . . . 4n and output conductor 1, are discharged through the high impedance element 6, while when the DA converter is in operation, no charge flows through the high impedance element 6, because the potential of the output conductor 1 has the average value of zero during an operation period, though the instantaneous value of said potential may vary within the range between $+V$ and $-V$, because a sequence of digital alternate current signals representing a voice is supplied to the DA converter as a switching input for the switches 51, 52, 53 ... 5n. Thus, no fluctuation of the potential of the output conductor 1 is caused by the insertion of the high impedance element 6, so that the exact DA conversion operation is ensured.

Figures 3A, 3B:
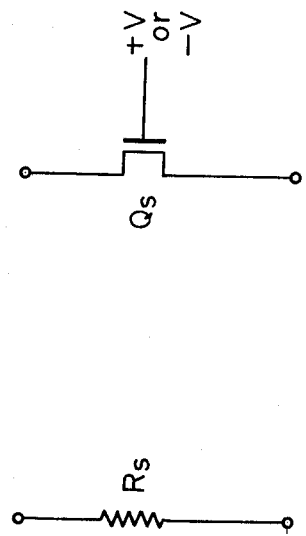
FIGS. 3A and 3B illustrate examples of the high impedance element in the DA converter of FIG. 2.

The high impedance element 6 may be constituted by a high resistor $R_s$ illustrated in FIG. 3A, a field effect transistor $Q_s$ controlled by the gate voltage $+V$ or $-V$ illustrated in FIG. 3B, and the like. The value of $R_s$ is determined by the leakage resistance $R_l$ ($R_l'$) and the length of a duration of DA conversion. As the upper limit, $R_s$ is sufficiently smaller than $R_l$ ($R_l \gg R_s$), while as the lower limit, $R_s$ is large enough to limit the flow of a charge through $R_s$ during the length of the duration of DA conversion, so that the fluctuation of the potential of the output conductor 1 is negligible. The following is an example.

Length of Duration of DA Conversion: 125 μsec
Total Capacitance of Capacitors
41, 42, 43 ... 4n: 200 pF
Allowable Fluctuations of Output
Voltage: 1/20 V
Current: $8 \times 10^{-8}$ A
$R_l$: $10^{15}$ to $10^{17}$ Ω
$R_s$: $10^7$ to $10^{13}$ Ω

We claim:

1. A digital-to-analog converter comprising an output conductor, a ground conductor, a power source conductor, a plurality of series connections of capacitors and switches connected between said output conductor and either of said ground conductor and said power source conductor, and an impedance conversion circuit connected directly to said output conductor, said output conductor producing the converted analog signals in accordance with the switching of said switches by digital input signals, characterized in that:

a high impedance element is connected between said output conductor and said ground conductor, said high impedance element being maintained in the conductive state throughout the operation and the nonoperation periods after the digital-to-analog converting operation of said digital-to-analog converter, the value of said high impedance being smaller than the leakage resistance of said output conductor and being large enough to make the fluctuation of the potential of the output conductor due to said high impedance negligible during the digital-to-analog converting operation of said digital-to-analog converter.

2. A digital-to-analog converter as defined in claim 1 wherein said high impedance element consists of a resistor of high resistance.

3. A digital-to-analog converter as defined in claim 2 wherein the value of said resistance is $10^7$ to $10^{13}$ Ω.

4. A digital-to-analog converter as defined in claim 1 wherein said high impedance element consists of a field effect transistor, to the gate of which a predetermined constant voltage is applied so that said field effect transistor is maintained in the conductive state throughout the operation and the nonoperation periods after the digital-to-analog converting operation of said digital-to-analog converter.

5. A digital-to-analog converter of the capacity voltage divider type comprising:
an output conductor;
a ground conductor;
a power source conductor;
a plurality of capacitors connected to said output conductor with the other side of each capacitor connected to a corresponding plurality of switches;
said plurality of switches connected to said ground conductor and said power source conductor for alternatively connecting said plurality of capacitors to one or the other thereof;
and means including a high impedance element connected between said output conductor and said ground conductor, said high impedance element being maintained in the conductive state throughout the operation and the nonoperation periods after the digital-to-analog converting operation of said digital-to-analog converter, the value of said high impedance being smaller than the leakage resistance of said output conductor and being large enough to make the fluctuation of the potential of the output conductor due to said high impedance negligible during the digital-to-analog converting operation of said digital-to-analog converter.

* * * * *

UNITED STATES PATENT AND TRADEMARK OFFICE
CERTIFICATE OF CORRECTION

PATENT NO. : 4,337,459
DATED : June 29, 1982
INVENTOR(S) : MASAUKI TAKAHASI et al.

It is certified that error appears in the above-identified patent and that said Letters Patent is hereby corrected as shown below:

Column 1, line 11, "DC" should be --DA--.

Signed and Sealed this

Twenty-second Day of February 1983

[SEAL]

Attest:

GERALD J. MOSSINGHOFF

Attesting Officer

Commissioner of Patents and Trademarks